(12) United States Patent
Kurihara et al.

(10) Patent No.: US 6,819,591 B1
(45) Date of Patent: Nov. 16, 2004

(54) METHOD FOR ERASING A MEMORY SECTOR IN VIRTUAL GROUND ARCHITECTURE WITH REDUCED LEAKAGE CURRENT

(75) Inventors: Kazuhiro Kurihara, Tokyo (JP); Ming-Huei Shieh, Cupertino, CA (US); Santosh Yachareni, San Jose, CA (US); Pau-Ling Chen, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/762,071

(22) Filed: Jan. 20, 2004

(51) Int. Cl.[7] .......................... G11C 16/04; G11C 16/06
(52) U.S. Cl. ........................... 365/185.09; 365/185.11; 365/185.29
(58) Field of Search ..................... 365/185.09, 185.11, 365/185.22, 185.29, 185.3, 185.33

(56) References Cited

U.S. PATENT DOCUMENTS

| 6,191,976 B1 | * | 2/2001 | Smayling et al. | ...... 365/185.33 |
| 6,567,303 B1 | * | 5/2003 | Hamilton et al. | ...... 365/185.29 |

* cited by examiner

*Primary Examiner*—Trong Phan
(74) *Attorney, Agent, or Firm*—Farjami & Farjami LLP

(57) ABSTRACT

An exemplary memory sector erase method comprises the steps of pre-programming a first bit and a second bit of a plurality of core memory cells of a plurality of memory blocks of a target memory sector, pre-programming one of a third bit and a fourth bit of a first neighboring memory cell adjacent to the target memory sector, and erasing the first bit and the second bit of the plurality of core memory cells of the plurality of memory blocks. According to another embodiment, the method further comprises programming the one of the third bit and the fourth bit of the first neighboring memory cell after the erasing step.

20 Claims, 5 Drawing Sheets

METHOD FOR ERASING A MEMORY SECTOR IN VIRTUAL GROUND ARCHITECTURE WITH REDUCED LEAKAGE CURRENT

TECHNICAL FIELD

The present invention relates generally to the field of semiconductor devices. More particularly, the present invention relates to semiconductor memory devices.

BACKGROUND ART

Memory devices are known in the art for storing electronic data in a wide variety of electronic devices and applications. A typical memory device comprises a plurality of memory cells where each memory cell defines a binary bit, i.e., either a zero ("0") bit or a one ("1") bit. For example, a memory cell may be defined as either being a "programmed" cell or an "erased" cell, where, according to one particular convention, a programmed cell is representative of a "0" bit, and an erased cell is representative of a "1" bit. In one type of memory cell, each memory cell stores two binary bits, a "left bit" and a "right bit." The left bit can represent a "0" or a "1" while the right bit can represent a "0" or a "1" independent of the left bit.

Memory cells are grouped into memory sectors, where each memory sector includes a number of memory cells. During a conventional memory sector erase operation, all the bits of each memory cell within a target memory sector are pre-programmed and then subsequently erased. An over-erase correction step may also be performed after erasing all the bits of each memory cell within a target memory sector to restore one or more over-erased cells in the target memory sector to a normally-erased state, as is known in the art. However, a number of problems still remain as a result of the conventional memory sector erase operation described above. First, neighboring memory cells adjacent to edge columns of the target memory sector can become over-erased. As a result, these neighboring memory cells can become a source of leakage current and can cause the memory device to improperly function or fail during read and program verify memory operations, for example. Similarly, neighboring memory cells adjacent to edge columns of redundant blocks associated with the target memory sector can also become a source of leakage current and can likewise cause the memory device to improperly function or fail during read and/or program verify operations involving target memory sector. Furthermore, any repaired blocks within the target memory sector can additionally become another source of leakage current and can also cause the memory device to improperly function or fail during read and/or program verify operations involving target memory sector. Accordingly, there exists a strong need in the art for a method for erasing a memory sector, which results in significantly reduced leakage current. There is also strong need in the art for a method for erasing a memory sector which results in a memory device with significantly reduced error and failure.

SUMMARY

The present invention is directed to a method for erasing a memory sector which results in significantly reduced leakage current. The present invention addresses and resolves the need in the art for a memory sector erase method which results in a memory device with significantly reduced error and failure. The present invention is suitable for erasing a target memory sector having a plurality of memory blocks, each of the plurality of memory blocks having a plurality of core memory cells, each of the plurality of core memory cells being capable of storing a first bit and a second bit. The target memory sector has a first edge column shared by a first neighboring memory cell. The first neighboring memory cell is capable of storing a third bit and a forth bit.

According to one exemplary embodiment, the method comprises the steps of pre-programming the first bit and the second bit of the plurality of core memory cells of the plurality of memory blocks, pre-programming one of the third bit and the fourth bit of the first neighboring memory cell, and erasing the first bit and the second bit of the plurality of memory cells of the plurality of memory blocks. The one of the third bit and the fourth bit of the first neighboring memory cell is typically adjacent to the first edge column.

According to another embodiment, the method further comprises programming the one of the third bit and the fourth bit of the first neighboring memory cell after the erasing step. In yet other embodiments, the method further comprises over-erase correcting the first bit and the second bit of the plurality of core memory cells of the plurality of memory blocks after the erasing step.

According to another embodiment, the method further comprises pre-programming the other one of the third bit and the fourth bit of the first neighboring memory cell prior to the erasing step, and programming the other one of the third bit and the fourth bit of the first neighboring memory cell after the erasing step.

With this arrangement, leakage current sources are significantly reduced during read and program verify memory operations. As a result, memory devices incorporating the method of the present invention will operate with significantly reduced error and failure. Other features and advantages of the present invention will become more readily apparent to those of ordinary skill in the art after reviewing the following detailed description and accompanying drawings.

DETAILED DESCRIPTION OF THE INVENTION

The present invention is directed to a method for erasing a memory sector which results in significantly reduced leakage current. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. In the present application, a memory sector on which an erase operation is to be performed is also referred to as a "target memory sector."

Figure 1:
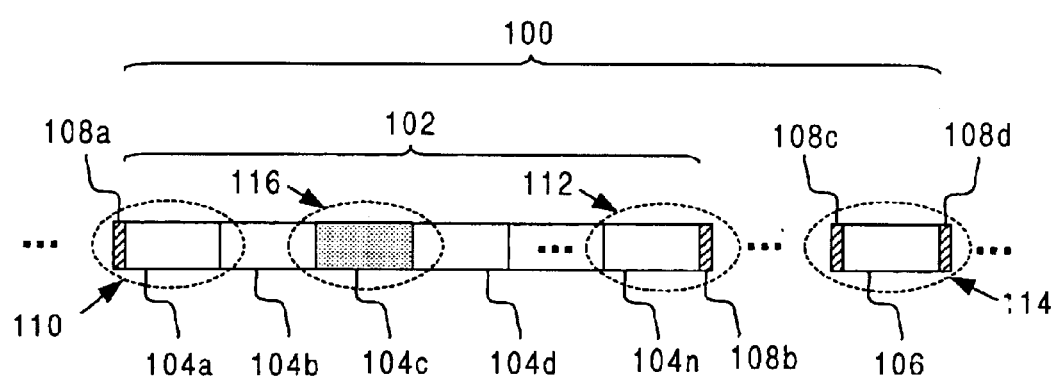
FIG. 1 depicts a functional block diagram of an exemplary target memory sector in accordance with one embodiment of the present invention.

FIG. 1 depicts a functional block diagram of exemplary target memory sector 100, which may be part of a larger memory device having a number of memory sectors, each of which is configured substantially as target memory sector 100. As described below, the present invention is suitable for use with memory devices using a "virtual ground" architecture capable of storing two independent bits in separate locations within a memory cell, such as Advanced Micro Devices, Inc. (AMD) MirrorBit™ memory devices. The memory sector erase method of the present invention will be described in relation to performing a sector erase of target memory sector 100, although the present invention is not limited to memory devices having the particular arrangement of target memory sector 100.

As shown in FIG. 1, target memory sector 100 includes a number of memory blocks 104a, 104b, 104c, 104d, and 104n within core area 102. Target memory sector 100 further includes redundant block 106, which may be used to replace a damaged block within core area 102. In the exemplary embodiment of FIG. 1, memory block 104c is identified as a damaged block. Memory block 104c is "repaired" by replacing memory block 104c with redundant block 106. In the present application, memory block 104c which has been replaced by redundant block 106 is also referred to as "repaired block 104c." According to one particular embodiment, core area 102 includes sixty four memory blocks, where each memory block 104a, 104b, 104c, 104d, and 104n further comprises sixteen core memory cells, each of the core memory cells capable of storing two binary bits. Likewise, redundant block 106 comprises sixteen redundant memory cells, each of the redundant memory cells capable of storing two binary bits.

Target memory sector 100 further comprises edges columns 108a and 108b, where edge column 108a is adjacent to memory block 104a, and edge column 108b is adjacent to memory block 104n. In the case where redundant block 106 is used to replace a damaged block, e.g., repaired block 104c in core area 102, target memory sector 100 further includes edge column 108c and edge column 108d of redundant block 106. As described more fully below, the memory sector erase method of the present invention accurately and reliably erases all the bits of target memory sector 100 while reducing or eliminating leakage current sources associated with target memory sector 100. For example, leakage current by way of edges columns 108a, 108b, 108c and 108d and leakage current by way of repaired block 104c are significantly reduced or eliminated due to the memory sector erase operation of the present invention.

Figure 2:
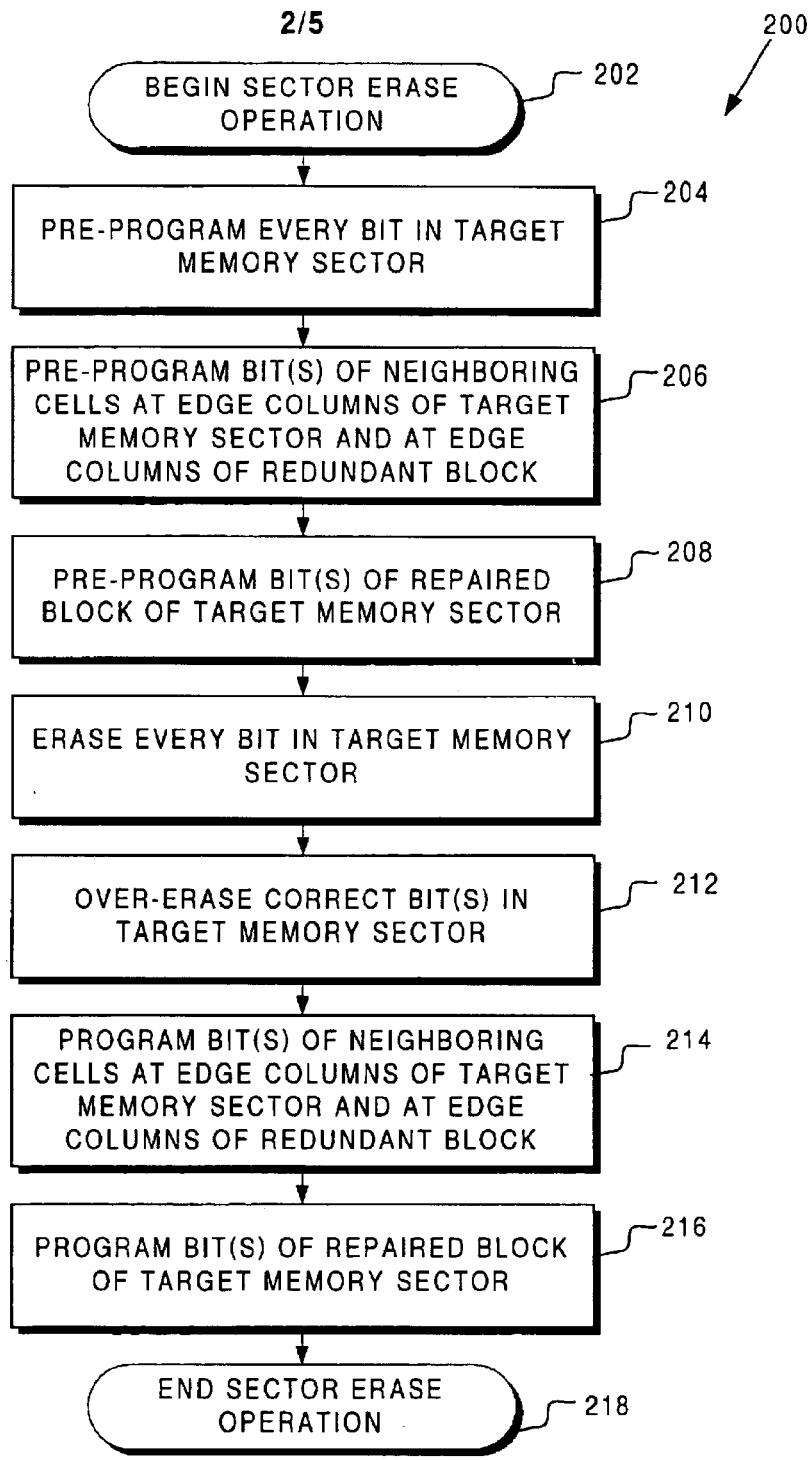
FIG. 2 depicts an exemplary flow chart for performing a memory sector erase method according to one embodiment of the present invention.

FIG. 2 shows flow chart 200 for performing a memory sector erase method according to one embodiment of the present invention in a memory device with a "virtual ground" architecture. Certain details and features have been left out of flow chart 200 of FIG. 2 that are apparent to a person of ordinary skill in the art. For example, a step may consist of one or more sub-steps or may involve specialized circuitry and/or connections, as known in the art. While steps 202 through 218 shown in flow chart 200 are sufficient to describe one embodiment of the present invention, other embodiments of the invention may utilize steps different from those shown in flow chart 200.

The memory sector erase method begins at step 202. At step 204, every bit in the target memory sector is pre-programmed. Thus, each bit of each core memory cell in target memory sector 100 of FIG. 1 is reset to a "0" bit representative of the programmed state prior to erase step 210 discussed below. If redundant block 106 of FIG. 1 is used to replace repaired block 104c, each bit of each redundant memory cell in redundant block 106 is also programmed during step 204.

At step 206, at least one bit of the neighboring memory cells is pre-programmed. With continuing reference to FIG. 1 and by way of example, neighboring memory cells are memory cells which are not in core area 102 of target memory sector 100 and which are adjacent to edge columns 108a and 108b. For example, in FIG. 3, region 310 of memory block 304a and region 312 of memory block 304n in core area 302 and edge columns 308a and 308b respectively correspond to region 110 of memory block 104a and region 112 of memory block 104n in core area 102 and edge columns 108a and 108b in FIG. 1. Memory bock 304a in region 310 includes core memory cells 320a and 320b, where core memory cell 320a shares edge column 308a with neighboring memory cell 324 at node 328. Similarly, memory block 304n in region 312 includes core memory cells 322a and 322b, where core memory cell 322a shares column edge 308b with neighboring memory cell 326 at node 330. During step 206, bit 334 of neighboring memory cell 324 is pre-programmed, i.e., reset to "0" bit representative of the programmed state prior to erase step 210. Likewise, bit 338 of neighboring memory cell 326 is pre-programmed. In certain embodiments, bit 336 of neighboring memory cell 324 and bit 340 of neighboring memory cell 326 are also pre-programmed. In yet other embodiments, the bits associated with neighboring memory cells adjacent to neighboring memory cells 324 and 326 are also pre-programmed.

Figure 4:
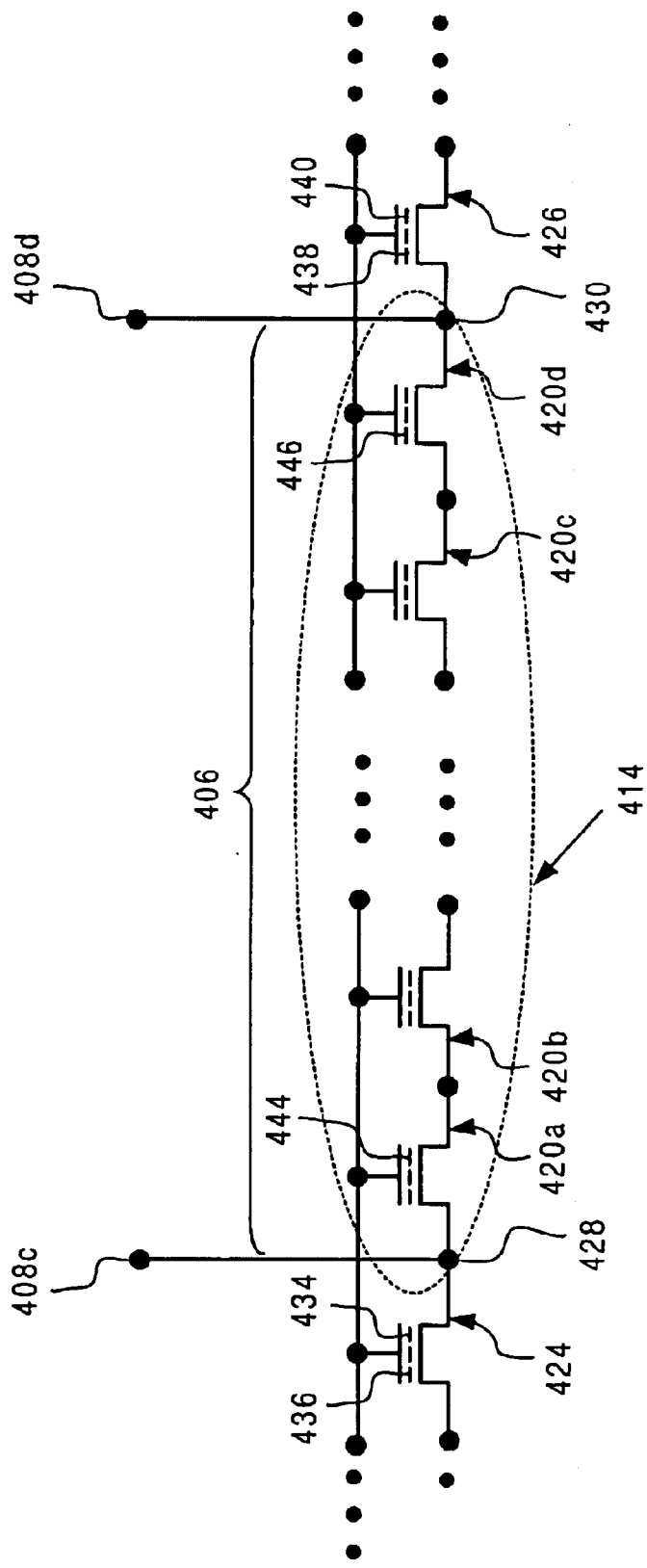
FIG. 4 depicts an enlarged view of the redundant block region of FIG. 1.

Also at step 206, in the case where redundant block 106 is used to replace repaired block 104c in core area 102, neighboring memory cells further comprises memory cells which are not in redundant block 106 and which are adjacent to edge columns 108c and 108d in FIG. 1. For example, FIG. 4 depicts region 414 of redundant block 406, and edge columns 408c and 408d, which correspond respectively to region 114 of redundant block 106, and edge columns 108c and 108d in FIG. 1. Redundant block 406 of region 414 includes redundant memory cells 420a, 420b, 420c and 420d, where redundant memory cell 420a shares edge column 408c with neighboring memory cell 424 at node 428, and where redundant memory cell 420d shares column edge 408d with neighboring memory cell 426 at node 430. During step 206, bit 434 of neighboring memory cell 424 is pre-programmed. Likewise, bit 438 of neighboring memory cell 426 is pre-programmed. In certain embodiments, bit 436 of neighboring memory cell 424 and bit 440 of neighboring memory cell 426 are also pre-programmed. In yet other embodiments, the bits associated with neighboring memory cells adjacent to neighboring memory cells 424 and 426 are also pre-programmed.

Figure 5:
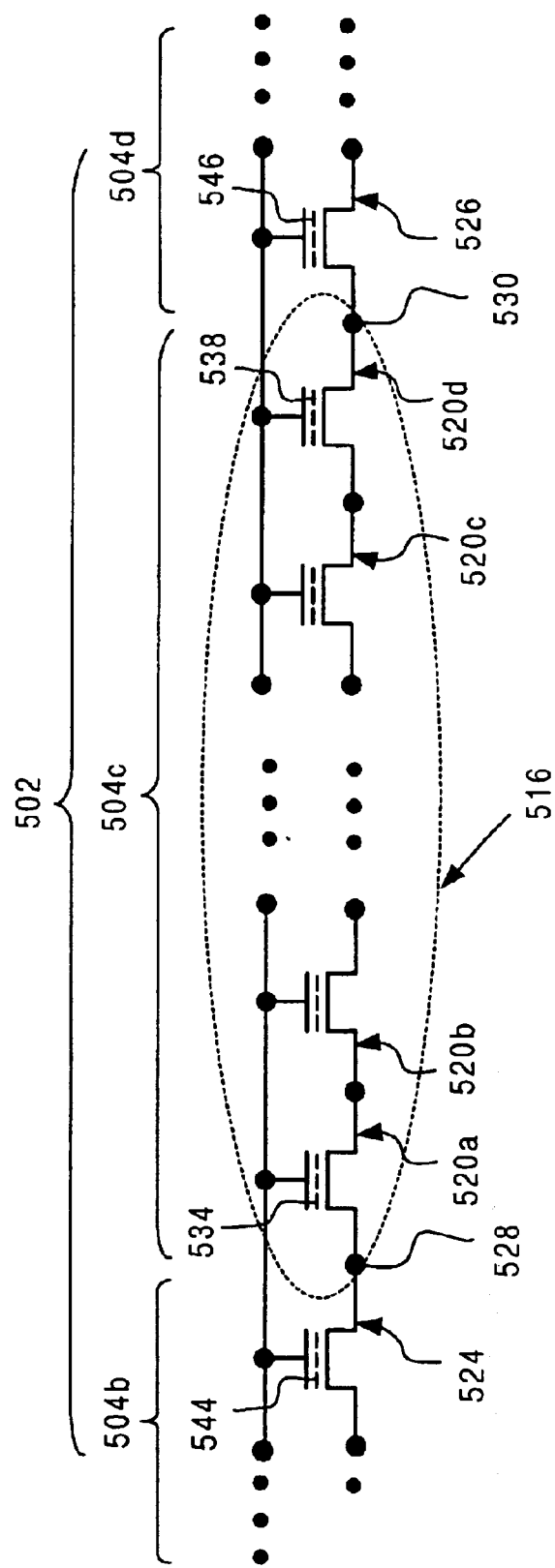
FIG. 5 depicts an enlarged view of the repaired block regions of FIG. 1.

At step 208, in the case where redundant block 106 is used to replace repaired block 104c in core area 102, one or more bits of repaired block 104c are pre-programmed. For example, in FIG. 5 core area 502, memory blocks 504b and 504d, and region 516 of repaired block 504c respectively correspond to core area 102, memory blocks 104b and 104d, and region 116 of repaired block 104c in FIG. 1. Repaired block 504c includes repaired memory cells 520a, 520b, 520c and 520d. Core memory cell 524 of memory block 504b shares node 528 with repaired memory cell 520a of repaired block 504c, and core memory cell 526 of memory block 504d shares node 530 with repaired memory cell 520d of repaired block 504c. During step 208, at least bit 534 of repaired memory cell 520a is pre-programmed, and at least bit 538 of repaired memory cell 520d is pre-programmed. In certain embodiments, all the bits of repaired memory cells 520a, 520b, 520c and 520d are pre-programmed during step 208.

At step 210, every bit in the target memory sector is erased. Thus, each bit of each core memory cell in target memory sector 100 of FIG. 1 is reset to "1" bit representative of the erased state during step 210. If redundant block 106 of FIG. 1 is used to replace repaired block 104c, each bit of each redundant memory cell in redundant block 106 is also erased during step 210.

At step 212, bits which have been over-erased during erase step 210 are corrected using an "over-erase" correction process. A bit becomes over-erased if its threshold voltage (Vt) is reduced below a certain value as a result of the erase procedure. An over-erase correction involves correcting the Vt of over-erased bits to a "normal" level during step 212, as is known in the art.

At step 214, the bits which were pre-programmed during step 206 are programmed after erase step 210. Thus, referring again to FIG. 3 by way of example, bit 334 of neighboring memory cell 324 is programmed, i.e., reset to "0" bit representative of the programmed state after erase step 210. Likewise, bit 338 of neighboring memory cell 326 is programmed during step 214. In certain embodiments, bit 336 of neighboring memory cell 324 and bit 340 of neighboring memory cell 326 are also programmed during step 214. In yet other embodiments, the bits associated with neighboring memory cells adjacent to neighboring memory cells 324 and 326 are also programmed during step 214. With continuing reference to FIG. 1 and FIG. 4, in the case where redundant block 106 is used to replace repaired block 104c in core area 102, bit 434 of neighboring memory cell 424 and bit 438 of neighboring memory cell 426 are programmed during step 214. In certain embodiments, bit 436 of neighboring memory cell 424 and bit 440 of neighboring memory cell 426 are also programmed, and in yet other embodiments, the bits associated with neighboring memory cells adjacent to neighboring memory cells 424 and 426 are also programmed during step 214.

At step 216, in the case where redundant block 106 is used to replace repaired block 104c in core area 102, the bits of repaired block 104c which were programmed during step 208 are programmed after erase step 210. With continuing referenced to FIG. 5, bit 534 of repaired memory cell 520a and 538 of repaired memory cell 520d are programmed during step 216. In certain embodiments, all the bits of repaired memory cells 520a, 520b, 520c and 520d are programmed during step 216. The memory sector erase operation is completed at step 218.

Figure 3:
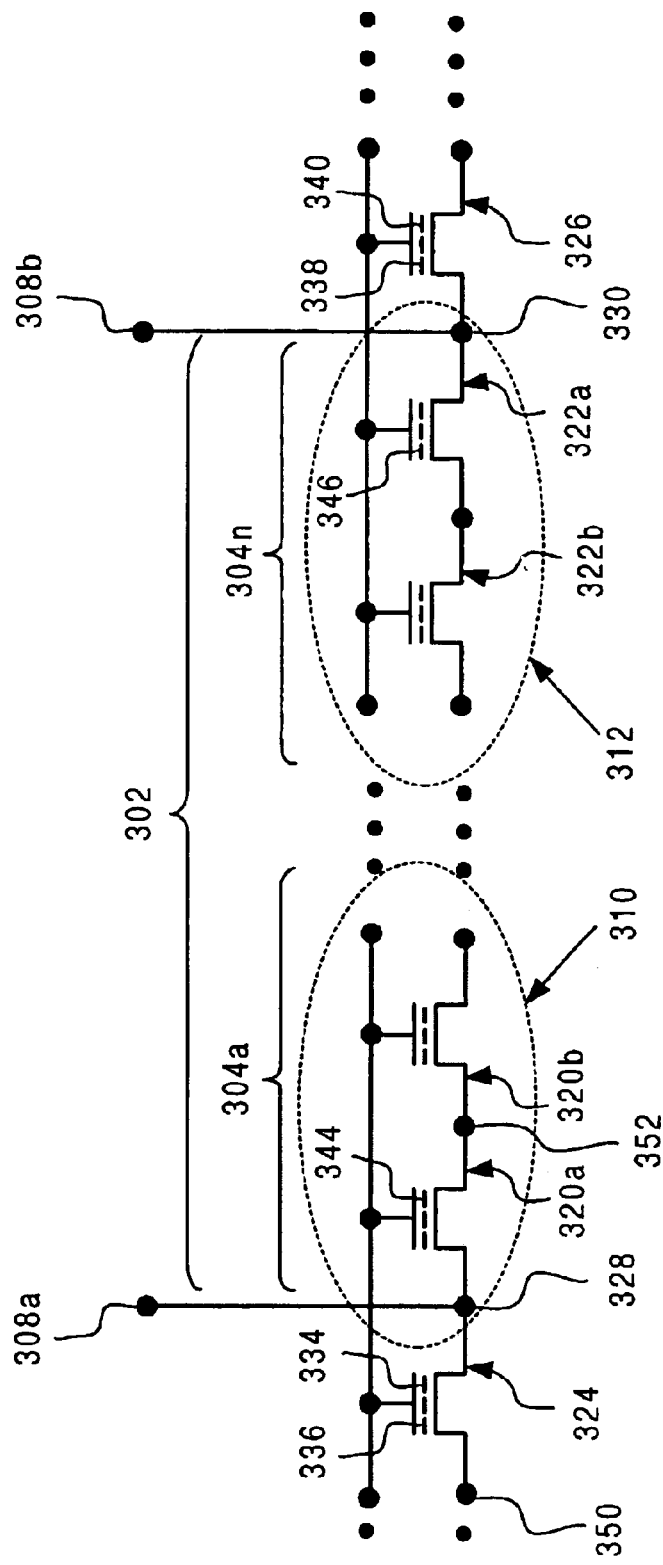
FIG. 3 depicts an enlarged view of core memory block regions of FIG. 1.

As a result of the memory section erase method outlined by flow chart 200, the sources of leakage current in memory sector 100 is significantly reduced. Referring to FIG. 3, for example, leakage current through bit 334 of neighboring memory cells 324 is significantly reduced when a program verify or read operation involving bit 344 of core memory cell 320a is being carried out. The reason is that since bit 334 is programmed at every memory sector erase cycle, as discussed above in conjunction by flow chart 200 of FIG. 2, leakage current through bit 344 is significantly reduced, and the appropriate voltages may be established at nodes 350, 328 and 352 in order to accurately and reliably perform a program verify or read operation involving bit 344 of core memory cell 320a. For similar reasons, leakage current through bit 338 of neighboring memory cell 326 is significantly reduced when a program verify or read operation involving bit 346 of core memory cell 322a is being carried out. Similarly, referring to FIG. 4, leakage current leakage current through bit 434 of neighboring memory cells 424 is significantly reduced when a program verify or read operation involving bit 444 of redundant memory cell 420a is being carried out, and leakage current through bit 438 of neighboring memory cell 426 is significantly reduced when a program verify or read operation involving bit 446 of redundant memory cell 420d is being carried out. Likewise, referring to FIG. 5, leakage current leakage current through bit 534 of repaired memory cell 520a is significantly reduced when a program verify or read operation involving bit 544 of core memory cell 524 is being carried out, and leakage current through bit 538 of repaired memory cell 520d is significantly reduced when a program verify or read operation involving bit 546 of core memory cell 526 is being carried out. As a further benefit, memory device employing the memory sector erase operation of the invention results in significantly reduced errors and failures during read and/or program verify operations.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, the number of memory blocks in the target memory sector, and the number of memory cells in each memory block may vary from those discussed above. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a method for erasing a memory sector which results in significantly reduced leakage current has been described.

What is claimed is:

1. A method for erasing a target memory sector, said target memory sector having a plurality of memory blocks, each of said plurality of memory blocks having a plurality of core memory cells, each of said plurality of core memory cells being capable of storing a first bit and a second bit, said target memory sector further having a first edge column, said first edge column being shared by a first neighboring memory cell, said first neighboring memory cell being capable of storing a third bit and a forth bit, said method comprising the steps of:

pre-programming said first bit and said second bit of said plurality of core memory cells of said plurality of memory blocks;

pre-programming one of said third bit and said fourth bit of said first neighboring memory cell;

erasing said first bit and said second bit of said plurality of core memory cells of said plurality of memory blocks.

2. The method of claim 1, further comprising programming said one of said third bit and said fourth bit of said first neighboring memory cell after said erasing step.

3. The method of claim 2, further comprising over-erase correcting said first bit and said second bit of said plurality of core memory cells of said plurality of memory blocks after said erasing step.

4. The method of claim 1, further comprising:
pre-programming the other one of said third bit and said fourth bit of said first neighboring memory cell prior to said erasing step;
programming said other one of said third bit and said fourth bit of said first neighboring memory cell after said erasing step.

5. The method of claim 1, wherein said one of said third bit and said fourth bit of said first neighboring memory cell is adjacent to said first edge column.

6. The method of claim 1, wherein at least one of said plurality of memory blocks is a repaired block, said target memory sector further including a redundant block having a plurality of redundant memory cells, each of said plurality of redundant memory cells being capable of storing a fifth bit and a sixth bit, said redundant block further having a second edge column, said second edge column being shared by a second neighboring memory cell, said second neighboring memory cell being capable of storing a seventh bit and an eighth bit, said method further comprising:
pre-programming one of said seventh bit and said eighth bit of said second neighboring memory cell;
wherein said erasing step further comprises erasing said fifth bit and said sixth bit of said plurality of redundant memory cells of said redundant block.

7. The method of claim 6, further comprising programming said one of said seventh bit and said eighth bit of said second neighboring memory cell after said erasing step.

8. The method of claim 6, wherein said repaired block includes a plurality of repaired memory cells, each of said plurality of repaired memory cells capable of storing a ninth bit and a tenth bit, said method further comprising pre-programming at least one of said ninth bit and said tenth bit of at least one of said plurality of repaired memory cells prior to said erasing step.

9. The method of claim 8, further comprising programming said at least one of said ninth bit and said tenth bit of said at least one of said plurality of repaired memory cells after said erasing step.

10. A method for erasing a target memory sector, said target memory sector having a plurality of memory blocks, each of said plurality of memory blocks having a plurality of core memory cells, each of said plurality of core memory cells being capable of storing a first bit and a second bit, said target memory sector further having a first edge column and a second edge column, said first edge column being shared by a first neighboring memory cell, said first neighboring memory cell being capable of storing a third bit and a forth bit, said second edge column being shared by a second neighboring memory cell, said second neighboring memory cell being capable of storing a fifth bit and a sixth bit, said method comprising the steps of:
pre-programming said first bit and said second bit of said plurality of core memory cells of said plurality of memory blocks;
erasing said first bit and said second bit of said plurality of core memory cells of said plurality of memory blocks;
programming said one of said third bit and said fourth bit of said first neighboring memory cell after said erasing step;
programming said one of said fifth bit and said sixth bit of said second neighboring memory cell after said erasing step.

11. The method of claim 10, further comprising:
pre-programming one of said third bit and said fourth bit of said first neighboring memory cell prior to said erasing step;
pre-programming one of said fifth bit and said sixth bit of said second neighboring memory cell prior to said erasing step.

12. The method of claim 10, wherein at least one of said plurality of memory blocks is a repaired block, said target memory sector further including a redundant block having a plurality of redundant memory cells, each of said plurality of redundant memory cells being capable of storing a seventh bit and an eighth bit, said redundant block further having a third edge column and a fourth edge column, said third edge column being shared by a third neighboring memory cell, said third neighboring memory cell being capable of storing a ninth bit and a tenth bit, said fourth edge column being shared by a fourth neighboring memory cell, said fourth neighboring memory cell being capable of storing an eleventh bit and a twelfth bit, wherein said erasing step further comprises erasing said seventh bit and said eighth bit of said plurality of redundant memory cells of said redundant block, said method further comprising:
pre-programming one of said ninth bit and said tenth bit of said third neighboring memory cell;
pre-programming one of said eleventh bit and said twelfth bit of said fourth neighboring memory cell;
programming said one of said ninth bit and said tenth bit of said third neighboring memory cell after said erasing step;
programming said one of said eleventh bit and said twelfth bit of said fourth neighboring memory cell after said erasing step.

13. The method of claim 12, wherein said repaired block includes a plurality of repaired memory cells including a first repaired memory cell and a second repaired memory cell, each of said plurality of repaired memory cell being capable of storing a thirteenth bit and a fourteenth bit, wherein said first repaired memory cell is capable of storing fifteenth bit and a sixteenth bit, said second repaired memory cell is capable of storing a seventeenth bit and an eighteenth bit, said method further comprising:
pre-programming one of said fifteenth bit and a sixteenth bit of said first repaired memory cell prior to said erasing step;
pre-programming one of said seventeenth bit and an eighteenth bit of said second edge memory cell prior to said erasing step;
programming said one of said fifteenth bit and a sixteenth bit of said first edge memory cell after said erasing step;
programming said one of said seventeenth bit and an eighteenth bit of said second edge memory cell after said erasing step.

14. The method of claim 12, wherein said repaired block includes a plurality of repaired memory cells, each of said plurality of repaired memory cell capable of storing a thirteenth bit and a fourteenth bit, said method further comprising pre-programming said thirteenth bit and said fourteenth bit of said plurality of repaired memory cells prior to said erasing step.

15. The method of claim 14, further comprising programming said thirteenth bit and said fourteenth bit of said plurality of repaired memory cells after said erasing step.

16. A method for erasing a target memory sector, said target memory sector having a plurality of memory blocks, each of said plurality of memory blocks having a plurality of core memory cells, each of said plurality of core memory cells being capable of storing a first bit and a second bit, said target memory sector further having a first edge column, said first edge column being shared by a first neighboring memory cell, said first neighboring memory cell being capable of storing a third bit and a forth bit, said method comprising pre-programming said first bit and said second bit of said plurality of core memory cells of said plurality of memory blocks, said method further comprising erasing said first bit and said second bit of said plurality of core memory cells of said plurality of memory blocks, said method being characterized by:

pre-programming one of said third bit and said fourth bit of said first neighboring memory cell prior to said erasing step.

17. The method of claim 16, further comprising programming said one of said third bit and said fourth bit of said first neighboring memory cell after said erasing step.

18. The method of claim 17, further comprising over-erase correcting said first bit and said second bit of said plurality of core memory cells of said plurality of memory blocks after said erasing step.

19. The method of claim 16, wherein at least one of said plurality of memory blocks is a repaired block, said target memory sector further including a redundant block having a plurality of redundant memory cells, each of said plurality of redundant memory cells being capable of storing a fifth bit and a sixth bit, said redundant block further having a second edge column, said second edge column being shared by a second neighboring memory cell, said second neighboring memory cell being capable of storing a seventh bit and an eighth bit, said method further comprising:

pre-programming one of said seventh bit and said eighth bit of said second neighboring memory cell;

wherein said erasing step further comprises erasing said fifth bit and said sixth bit of said plurality of redundant memory cells of said redundant block.

20. The method of claim 19, further comprising programming said one of said seventh bit and said eighth bit of said second neighboring memory cell after said erasing step.

* * * * *